United States Patent
Ko et al.

(10) Patent No.: US 9,871,010 B2
(45) Date of Patent: Jan. 16, 2018

(54) TIN ALLOY ELECTROPLATING SOLUTION FOR SOLDER BUMPS INCLUDING PERFLUOROALKYL SURFACTANT

(71) Applicant: APCT CO., LTD, Sejong-si (KR)

(72) Inventors: Jung Woo Ko, Seoul (KR); Jeong Hun Oh, Siheung-si (KR); Kyu Bin Park, Pohang-si (KR); Hyun Kook Park, Busan (KR); Heung Su Jung, Yongin-si (KR)

(73) Assignee: APCT CO., LTD, Sejong (KR)

( * ) Notice: Subject to any disclaimer, the term of this patent is extended or adjusted under 35 U.S.C. 154(b) by 164 days.

(21) Appl. No.: 14/810,414

(22) Filed: Jul. 27, 2015

(65) Prior Publication Data

US 2016/0035685 A1  Feb. 4, 2016

(30) Foreign Application Priority Data

Jul. 31, 2014  (KR) .................. 10-2014-0098394

(51) Int. Cl.
  *H01L 23/00*  (2006.01)
  *C25D 3/32*  (2006.01)
  (Continued)

(52) U.S. Cl.
  CPC ............... *H01L 24/11* (2013.01); *C25D 3/32* (2013.01); *C25D 3/46* (2013.01); *C25D 5/02* (2013.01); *C25D 5/10* (2013.01); *C25D 7/123* (2013.01); *H01L 24/03* (2013.01); *H01L 24/05* (2013.01); *H01L 24/13* (2013.01); *H01L 24/94* (2013.01); *H01L 2224/0345* (2013.01); *H01L 2224/05647* (2013.01); *H01L 2224/1147* (2013.01); *H01L 2224/11462* (2013.01); *H01L 2224/11849* (2013.01); *H01L 2224/13111* (2013.01); *H01L 2224/13147* (2013.01);
  (Continued)

(58) Field of Classification Search
  CPC ... C25D 3/30; C25D 3/32; C25D 3/60; C25D 5/02; C25D 5/022; C25D 5/10; C25D 3/46; H01L 24/11; H01L 24/13; H01L 24/94; H01L 2224/1311; H01L 2224/11849; H01L 2224/1147; H01L 2224/94; H01L 2224/05647; H01L 2224/0345; H01L 2224/13147; H01L 2224/11462; H01L 2224/10253
  See application file for complete search history.

(56) References Cited

U.S. PATENT DOCUMENTS

| | | | | |
|---|---|---|---|---|
| 4,381,228 A | * | 4/1983 | Teichmann | C25D 3/32 205/241 |
| 2009/0145765 A1 | * | 6/2009 | Abys | C25D 3/30 205/109 |
| 2015/0308007 A1 | * | 10/2015 | Park | C25D 3/32 438/614 |

* cited by examiner

*Primary Examiner* — Louis J Rufo
(74) *Attorney, Agent, or Firm* — STIP Law Group, LLC

(57) ABSTRACT

Disclosed is a tin-based electroplating solution for forming solder bumps of a flip chip package. The tin-based electroplating solution includes tin methanesulfonate, silver methanesulfonate, methanesulfonic acid, a fluorinated surfactant, an aromatic polyoxyalkylene ether, and water. Also disclosed is a method for forming solder bumps by using the electroplating solution. The method includes (1) electroplating a silicon wafer having a protective layer through which an electrode pad is exposed and an under bump metallurgy (UBM) layer with a copper or copper/nickel plating solution to form copper or copper/nickel pillars on the under bump metallurgy layer and (2) electroplating the pillars with the tin-based electroplating solution to form solder bumps.

10 Claims, 6 Drawing Sheets

(51) Int. Cl.
- *C25D 7/12* (2006.01)
- *C25D 5/02* (2006.01)
- *C25D 3/46* (2006.01)
- *C25D 5/10* (2006.01)

(52) U.S. Cl.
CPC ............... *H01L 2224/13155* (2013.01); *H01L 2224/94* (2013.01); *H01L 2924/0132* (2013.01); *H01L 2924/10253* (2013.01)

| | | |
|---|---|---|
| A |  | UBM Sputtering |
| B |  | PR Coating/Developing |
| C |  | Cu or Cu/Ni Electroplating |
| D |  | SnAg Electroplating |
| E |  | PR Stripping |
| F |  | Metal Etching, Reflow |

| Condition | 10 ASD |
|---|---|
| Magnification | x 3,000 |
| (a) |  |
| (b) |  |

TIN ALLOY ELECTROPLATING SOLUTION FOR SOLDER BUMPS INCLUDING PERFLUOROALKYL SURFACTANT

CROSS REFERENCE TO PRIOR APPLICATIONS

This application claims priority to Korean Patent Application No. 10-2014-0098394 filed Jul. 31, 2014, which is hereby incorporated by reference in its entirety.

BACKGROUND OF THE INVENTION

1. Field of the Invention

The present disclosure relates to a tin-based electroplating solution that is used to form solder bumps in a flip-chip packaging process.

2. Description of the Related Art

With the advent of small, slim, high-performance electronics, there has been an increasing demand for fast operation and improved electrode density of essential devices, such as memories. Under such circumstances, flip-chip packaging techniques are rapidly extended and applied to the fabrication of electronic devices. Conventional wire bonding processes involve connecting chips to boards with fine wires. Tape automated bonding (TAB) processes involves arranging chips on flexible tapes. However, these conventional processes have limitations in achieving reduced system size or improved electrical performance. In flip-chip packaging processes, solder bumps are formed on a pad of integrated circuit chips and are directly bonded to a circuit board by heating. That is, flip-chip packaging processes are area array packaging processes that utilize the entire area of chips, unlike wire bonding or TAB processes using only the edges of chips. Therefore, flip-chip packaging processes enable the formation of a significantly increased number of input/output terminals per unit area and are thus suitable for fine pitch applications. In addition, flip-chip packaging processes use solder bumps whose length is shorter than bonding wires, ensuring excellent electrical properties. Due to these advantages, flip-chip packaging processes can minimize the size of packages, thus being suitable for the manufacture of lightweight, thin, compact, high-performance, and fast operating electronic products. In addition, flip-chip packaging processes can provide a solution to noise problems. Such techniques are extendable and applicable to the display, semiconductor, and other relevant industries, including CPU and memory industries.

Such flip chip packages take various forms, but most of them use solder bumps composed of copper (or copper/nickel) pillars and tin alloy bumps on a copper-based under bump metallurgy (UBM) layer. Many problems need to be solved in the development of processes for the formation of alloy-based solder bumps. For example, there are problems associated with defectiveness, yield, and quality of products, such as height variations of within die (WID) and within wafer (WIW) bumps, the formation of empty space inside bumps, and the occurrence of cracks in intermetallic compound layers.

SUMMARY OF THE INVENTION

An object of the present invention is to provide a perfluoroalkyl surfactant-containing tin-based electroplating solution for the formation of tin-based solder bumps on a metal-based UBM layer for a flip chip package by electroplating that is advantageous in terms of current efficiency, leaves no cracks in intermetallic compound (IMC) layers and no empty spaces inside bumps, can be used to form bumps with high flatness and small height variation, and is applicable to high speed plating. A further object of the present invention is to provide a method of forming solder bumps for a flip chip by using the tin-based electroplating solution.

One aspect of the present invention provides a tin-based electroplating solution including tin methanesulfonate in such an amount that the tin content of the plating solution is from 40 to 105 g/L, 70 to 210 g/L of methanesulfonic acid, 0.01 to 100 mg/L of a fluorinated surfactant, 0.5 to 60 g/L of an aromatic polyoxyalkylene ether, and water. The tin-based electroplating solution may optionally include silver methanesulfonate in such an amount that the silver content of the plating solution is from 0.40 to 3.0 g/L. In this case, the tin-silver alloy electroplating solution may further include 130 to 350 g/L of a complexing agent.

In addition to the above-described components, the electroplating solution of the present invention may further include various kinds of organic additives. In this case, the organic additives are suitably present at a total concentration of 6.0 to 650 g/L. The kinds of the organic additives suitable for use in the tin-based electroplating solution of the present invention may be determined by those skilled in the art according to the intended applications and detailed descriptions thereof are thus omitted herein. For example, the organic additives may be accelerators, inhibitors, defoaming agents, organic antioxidants, and grain-refining agents. Specific examples of the organic additives are hydroxybenzene-based antioxidants, such as phenol, hydroquinone, and resorcinol, which may be used alone or in combination thereof. In one embodiment of the present invention, the electroplating solution contains 0.05 to 10 mg/L of the fluorinated surfactant.

The fluorinated surfactant may be selected from a perfluoroalkyl phosphate salt, a perfluoroalkyl sulfate, a perfluoroalkyl sulfonate salt, and mixtures thereof.

The perfluoroalkyl phosphate salt is a mixture containing mono- and di-$C_6$-$C_{12}$ perfluoroalkyl phosphate salts wherein the monoester salt accounts for 33 to 45% by weight of the total weight of the monoester salt and the diester salt. The perfluoroalkyl phosphate salts have an apparent average molecular weight of 560 to 980. The mono- and di-fluoroalkyl phosphate salts are obtained by reacting a mixture of mono- and di-perfluoroalkyl phosphates with at least one alkali selected from the group consisting of sodium hydroxide, potassium hydroxide, and lithium hydroxide.

The perfluoroalkyl sulfate is a surfactant containing a perfluoroalkyl sulfamate and water.

The perfluoroalkyl sulfonate salt is a surfactant including a $C_6$-$C_{12}$ perfluoroalkyl group.

In one embodiment of the present invention, the perfluoroalkyl groups of the three kinds of surfactants are unbranched straight chained.

A further aspect of the present invention discloses a method of forming solder bumps for a flip chip by using the tin-based electroplating solution. Specifically, the method includes: electroplating a silicon wafer having a protective layer through which an electrode pad is exposed and an under bump metallurgy (UBM) layer with a copper or copper/nickel plating solution to form copper or copper/nickel pillars on the under bump metallurgy layer; and electroplating the pillars with the tin-based electroplating solution to form solder bumps.

In one specific embodiment of the present invention, the electroplating solution is filtered through a cartridge filter to remove precipitates or impurities impeding the formation of the alloy solder bumps.

After the formation of metal pillars on an UBM layer, solder bumps can be formed on the metal pillars using the tin-based electroplating solution of the present invention. The presence of the fluorinated surfactant can improve the surface tension, wettability, and spreadability of the tin-based electroplating solution. As a result, the current efficiency of the plating process can be enhanced, the occurrence of cracks in intermetallic compound layers and the formation of empty spaces inside bumps can be prevented, height variations of WID and WIW bumps can be reduced, and a flip chip package can be obtained whose plating film properties are excellent even in the high speed plating range (10 to 19 A/dm$^2$).

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

The present invention will now be described in detail.

Figure 1:
FIG. 1 schematically shows the overall flip-chip packaging process including forming a copper pillar on an under bump metallurgy layer and forming a solder bump on the copper pillar using a tin-based plating solution.
Figure 1:
Figure 1:
Figure 1:
Figure 1:
Figure 1:

FIG. 1 schematically shows the overall flip-chip packaging process including forming a copper pillar on an under bump metallurgy layer and forming a solder bump on the copper pillar using a tin-based plating solution. In FIG. 1, A shows the formation of a copper UBM layer on a patterned wafer consisting of chips by sputtering, B shows the formation of a photoresist (PR) pattern, C shows the formation of a copper or copper/nickel pillar by electroplating, D shows the formation of a tin-silver bump on the copper pillar by electroplating, E shows the removal of the photoresist, and F show metal etching and reflow.

One aspect of the present invention discloses an aqueous, tin-based or tin-silver-based electroplating solution, which can be used in step D of the process shown in FIG. 1. The tin-based electroplating solution of the present invention includes the following components:

A) tin methanesulfonate in such an amount that the tin content of the plating solution is from 40 to 105 g/L;

B) silver methanesulfonate, as an optional component, in such an amount that the silver content of the plating solution is from 0.40 to 3.0 g/L;

C) 70 to 210 g/L of methanesulfonic acid;

D) 0.01 to 100 mg/L of a fluorinated surfactant;

E) 0.5 to 60 g/L of an aromatic polyoxyalkylene ether; and

F) water.

In one specific embodiment of the present invention, the tin methanesulfonate may be used in such an amount that the tin content of the plating solution is from 80 to 100 g/L. The presence of the tin methanesulfonate in such an amount that the tin content of the electroplating solution is within the range defined above is preferred in terms of current efficiency upon tin-based bump formation.

In one specific embodiment of the present invention, the tin methanesulfonate (based on the final tin content (10-20 wt %)) used in the electroplating solution is prepared by oxidization of tin in commercial 65 to 75% methanesulfonic acid by electrolysis.

The tin-based electroplating solution of the present invention may include only tin as a plating metal or may be an alloy plating solution including tin and silver.

In one specific embodiment of the present invention, the silver methanesulfonate (based on the final silver content (2-7 wt %)) used in the electroplating solution may be prepared by oxidation of silver in commercial 65 to 75% methanesulfonic acid by electrolysis or dissolution of silver oxide in commercial 65 to 75% methanesulfonic acid.

In one embodiment of the present invention, the tin-based electroplating solution may include silver. In this embodiment, the tin-based electroplating solution may optionally further include a complexing agent. Any general complexing agent that is capable of forming a complex with silver in the field of electroplating may be used without particular limitation in the present invention. In one specific embodiment of the present invention, the complexing agent may be present at a concentration of 130 to 350 g/L in the electroplating solution.

The methanesulfonic acid used in the electroplating solution of the present invention may be any of the commercial grade products used in the field of electroplating. In one specific embodiment of the present invention, the methanesulfonic acid used in the electroplating solution and the methanesulfonic acid used for the preparation of the tin or silver methanesulfonate are purchased in the market and purified before use. For example, the methanesulfonic acid may be purified by activated carbon filtration, bubbling or treatment in a bath to remove impurities, such as chlorine and sulfur compounds. The activated carbon may typically have an average particle size of 40 to 100 μm, a surface area of 500 m$^2$/g or more, and an average pore diameter of 10 to 20 Å. After filtration of the methanesulfonic acid, the filtrate may be passed through a cartridge filter having a pore size of several micrometers to remove the activated carbon and impurities. Alternatively, the methanesulfonic acid may be purified by bubbling with nitrogen or air for about 6 to about 12 hours. Alternatively, the concentration of the methanesulfonic acid is adjusted with ultrapure water to an appropriate level after standing at 60 to 85° C. for about 6 to about 12 hours.

The perfluoroalkyl group of the fluorinated surfactant may be a perfluorinated straight-chain alkyl, branched alkyl or cycloalkyl group.

In one embodiment of the present invention, the fluorinated surfactant is a composition including mono- and di-perfluoroalkyl phosphate salts. In one embodiment, the surfactant composition is obtained by treatment of the phosphate mixture with an alkali. The alkali may be any of those that are commonly used in the art. Examples of such alkalis include, but are not limited to, sodium, potassium, and lithium. Materials obtained by the alkali treatment include neutral salts (i.e. sodium, potassium, lithium, and ammonium salts) formed by reaction of the mono- and di-perfluoroalkyl phosphates with the alkali. This alkali treatment can increase the hydrophilicity of the surfactant.

In a specific embodiment of the present invention, the mixture of the perfluorinated phosphate salts may be an ester mixture containing a monoester salt having a structure of 1-I and a diester salt having a structure of 1-II represented by Formula 1:

(1)

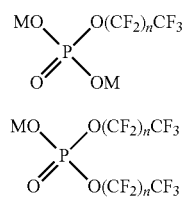

wherein each n in Formula 1 is a natural number, preferably an integer ranging from 5 to 11. In a more specific embodiment, each n is 7. When each n is within the range defined above, low viscosity and flowability of the surfactant can be attained, achieving improved workability. In addition, the hydrophilicity and hydrophobicity of the surfactant are adjustable, ensuring good dispersibility and processing stability. In the formulae, each M is an alkali metal. The monoester salt accounts for 33 to 45% by weight of the total weight of the monoester salt and the diester salt. In the ester salt mixture, the ester salt components have an apparent average molecular weight of 560 to 980.

In a further embodiment of the present invention, the fluorinated surfactant is a perfluoroalkyl sulfate surfactant. The perfluoroalkyl sulfate is distinguished from a perfluoroalkyl sulfonate in that the perfluoroalkyl group is connected to the sulfur atom through the oxygen atom. As the anionic surfactant, there may also be used an ester of chlorosulfonic acid ($ClSO_3H$) or sulfamic acid ($NH_2SO_3H$) and a perfluorinated alcohol or optionally an alkali salt of the ester.

In a specific embodiment of the present invention, the perfluoroalkyl sulfate surfactant may be a sulfamate having a structure represented by Formula 2:

(2)

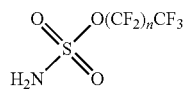

In one specific embodiment of the present invention, n in Formula 2 is an integer from 5 to 11. In a more specific embodiment, n is 7. When n is within the range defined above, low viscosity and flowability of the surfactant can be attained, achieving improved workability. In addition, the hydrophilicity and hydrophobicity of the surfactant are adjustable, ensuring good dispersibility and processing stability. The water content of the sulfamate surfactant may be from 30 to 90% by weight. The use of the sulfamate as the sulfuric acid-based surfactant is advantageous in that an ammonium salt as a charged ionic species (a protonated amino group) can be obtained with the perfluoroalkyl ester only. Due to this advantage, the use of the sulfamate can avoid the need for alkali treatment to enhance the hydrophilicity of the surfactant, unlike the use of sulfuric acid or chlorosulfuric acid.

In a further embodiment of the present invention, the fluorinated surfactant is a perfluoroalkyl sulfonate salt surfactant.

In a specific embodiment of the present invention, the perfluoroalkyl sulfonate salt surfactant may have a structure represented by Formula 3:

(3)

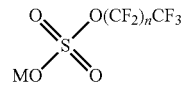

wherein n in Formula 3 is a natural number, preferably an integer ranging from 5 to 11. In a more specific embodiment, n is 7. When n is within the range defined above, low viscosity and flowability of the surfactant can be attained, achieving improved workability. In addition, the hydrophilicity and hydrophobicity of the surfactant are adjustable, ensuring good dispersibility and processing stability. The perfluoroalkyl sulfonate salt may be potassium perfluorinated octyl sulfonate (n=7, M=potassium).

In the tin-based electroplating solution of the present invention, the fluorinated surfactant can exhibit dispersion, emulsification, and defoaming effects. The fluorinated surfactant functions to make the crystal of the plating metal fine, improving the grain size and shape characteristics of bumps. Other functions of the fluorinated surfactant are to reduce the height variations of bumps (WID and WIW) and to prevent the formation of empty spaces inside bumps and cracks in intermetallic layers.

The fluorinated surfactant may be a commercially available product.

0.01 to 100 mg/L of the fluorinated surfactant is included in the tin-based electroplating solution. In one specific embodiment of the present invention, the content of the fluorinated surfactant may be adjusted to the range of 0.05 to 10 mg/L. Within this range, the tin-based crystal on the surface of bumps can be made fine, the height variation of bumps can be reduced, and the formation of empty spaces inside bumps and cracks in intermetallic layers can be prevented.

The electroplating solution of the present invention may further include organic additives. The total concentration of the additives and the fluorinated surfactant is suitably adjusted to 10 to 100 g/L. The kinds of the organic additives suitable for use in the tin-based electroplating solution of the present invention may be determined by those skilled in the art according to the intended applications and detailed descriptions thereof are thus omitted herein. Examples of the organic additives include grain-refining agents, complexing agents, antioxidants, and defoaming agents.

The electroplating solution of the present invention is preferably subjected to filtration before use for electroplating. After the components of the plating solution are mixed with stirring, the plating solution may be filtered through a cartridge filter having a pore size of several micrometers to remove precipitates or impurities. The pore size of the cartridge filter may be, for example, from 0.2 to 6 μm. A filter paper having a pore size of 0.2 to 6 μm may also be used.

A further aspect of the present invention provides a method of producing solder bumps for a flip chip by using the tin-based electroplating solution. The method of the present invention involves the formation of copper-based metal pillars on an UBM layer and the plating of tin or tin-silver alloy solder bumps thereon. Preferably, the tin-based electroplating solution is applied within 12 hours after copper or copper/nickel pillars are formed on an UBM layer. At this time, tin plating or tin-silver alloy plating may be performed in a continuous process. This continuous plating process within 12 hours can minimize the intermetallic adhesion resulting from the formation of oxide films on the copper or nickel surface or the occurrence of cracks and defects between the metal layers.

Specifically, the method of the present invention includes (A) electroplating a silicon wafer having a protective layer through which an electrode pad is exposed and an under bump metallurgy (UBM) layer with a copper or copper/nickel plating solution to form copper or copper/nickel pillars on the under bump metallurgy layer and (B) electroplating the pillars with the tin-based electroplating solution to form solder bumps.

There is no restriction on the electroplating method for the formation of the copper or copper/nickel pillars on the under bump metallurgy layer and the copper or copper/nickel electroplating solution used in the electroplating method in step (A). The plating method and the plating solution may be those that are commonly used in the art. For example, the copper electroplating solution may be one that includes copper sulfate, sulfuric acid ($H_2SO_4$), hydrochloric acid, water, and optionally additives. The copper electroplating solution may be commercially available from JCU, Co., Ltd. (Japan) under the trade name Cu-BRITE BUHD.

The tin-based electroplating for the formation of solder bumps in step (B) may be performed by any suitable process known in the art and thus specific conditions thereof are not described herein. For example, the electroplating may be performed using a silicon wafer, as a cathode, formed with the copper pillars on the UBM layer and an inert metal electrode (e.g., a platinum electrode or platinum-coated electrode) as an anode. In one embodiment, the electroplating for the formation of solder bumps in step (B) may be performed at a current density of 3 to 20 $A/dm^2$. In a preferred embodiment, high speed plating is possible at a current density of 10 to 19 $A/dm^2$. After the formation of solder bumps, solder reflow may follow.

The present invention will be explained with reference to the following examples. However, these examples are provided for illustrative purposes only and are in no way intended to limit the scope of the invention.

EXAMPLES

Preparative Example 1: Formation of Copper Pillars

Figure 2:
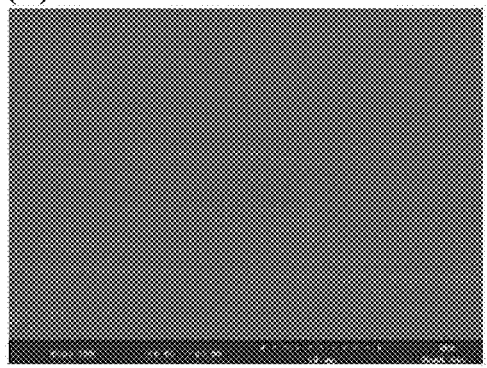
FIG. 2 shows top and side electron microscopy images of copper pillars formed on an under bump metallurgy (UBM) layer of a 12-inch patterned wafer (2a: ×7000, 2b: ×3000 magnifications)
Figure 2:
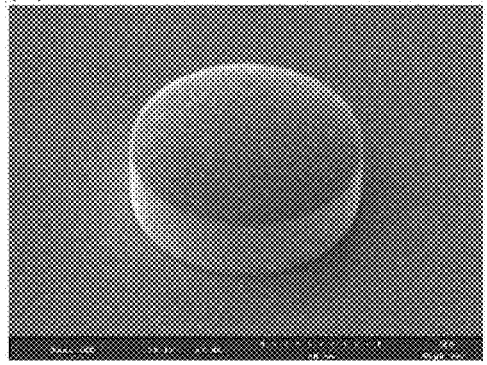

In this example, copper pillars were formed on a copper under bump metallurgy (UBM) layer of a flip chip semiconductor package. Specifically, a commercial copper sulfate-based electroplating solution containing $CuSO_4.5H_2O$, $H_2SO_4$, HCl, $H_2O$, and organic additives (Cu-BRITE BUHD, JCU Co., Ltd., Japan) was plated on a 12-inch patterned wafer to form copper pillars. The copper electroplating was performed according to the manufacturer's recommendation and thus a brief explanation is herein given of the plating conditions. The plating solution was stirred at room temperature and plated at a current density of 10 $A/dm^2$ until the height of copper pillars reached 10 μm. FIG. 2 shows electron microscopy images of the copper pillars formed under the above conditions.

Example 1: Preparation of Tin-Silver Plating Solution

Tin methanesulfonate (based on the final tin content (95 g/L)), silver methanesulfonate (based on the final silver content (2.0 g/L)), 100 g/L of methanesulfonic acid, 0.1 mg/L of potassium perfluorinated octyl sulfonate, 13.5 g/L of polyoxyethylenestyrenic phenyl ether, 1.5 g/L of polyoxyethylene bisphenol F ether, and 270 g/L of thiodiglycol as a complexing agent were mixed with stirring and filtered through a cartridge filter having a pore size of several micrometers to prepare a tin-silver alloy plating solution.

Evaluation Example 1: Galvanostatic Plating

Figure 3:
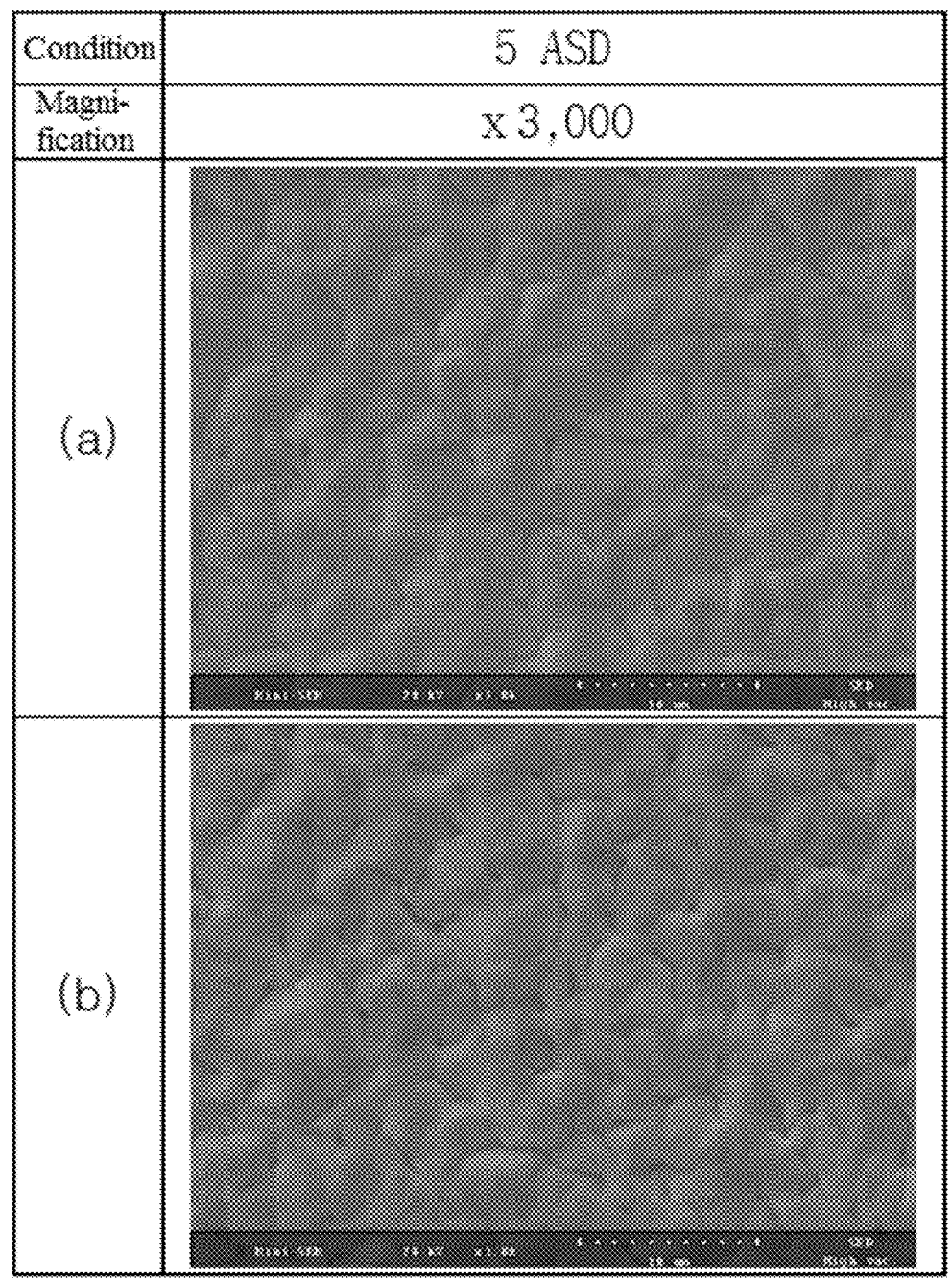
FIGS. 3 and 4 are electron microscopy images of the surfaces of tin-silver alloy structures formed on brass plates by galvanostatic plating under different conditions according to embodiments of the present invention.
Figure 4:
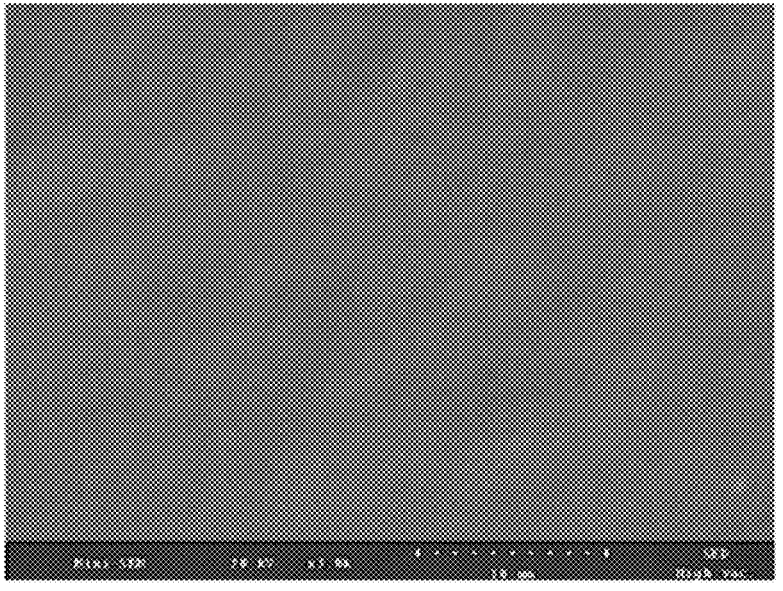
Figure 4:
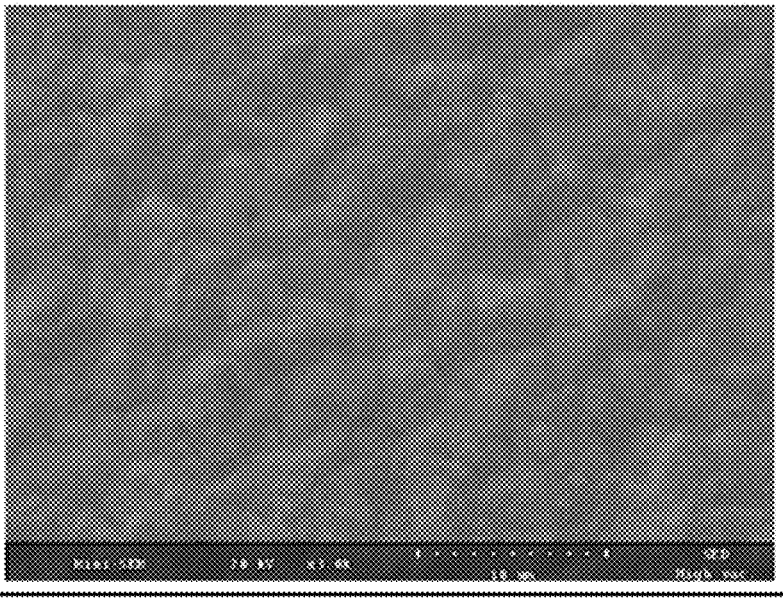

In this example, galvanostatic plating was performed using the tin-silver alloy plating solution of Example 1 and the characteristics of the plated tin-silver alloy were evaluated. For galvanostatic plating, the cross section of a brass plate having a size of 2×2 $cm^2$ was used as a cathode and a platinum-coated titanium electrode was used as an anode. Galvanostatic plating was performed at current densities of 5 and 10 $A/dm^2$ while stirring 250 mL of the plating solution at a rate of 100 rpm until the thickness reached 20 μm. The results are shown in FIGS. 3 and 4. The surface shapes of the tin-silver plated layers formed at current densities of 5 ASD and 10 ASD are shown in FIGS. 3 and 4, respectively.

Example 2: Characteristics of Tin-Based Solder Bumps

In this example, the shapes and characteristics of tin-silver alloy bumps were observed. The tin-silver electroplating solution of Example 1 was electroplated on the copper pillars, which were formed on the 12-inch patterned wafer in Preparative Example 1, to form solder bumps. The tin-silver electroplating was performed at a current density of 13 $A/dm^2$ while stirring the plating solution at room temperature. The plating speed was 6.6 μm/min at 13 $A/dm^2$. A current efficiency of 99.5% and a silver content of 2.2% were attained. After heating to 240° C. at a rate of 2° C./min and cooling at a rate of 3° C./min, solder reflow was performed. The solder bumps were well patterned (bump CD 20-60 μm, bump pitch 95-190 μm) and the plating tendency was good regardless of the shape (pillar or mushroom shape) of the solder bumps. Meanwhile, tin-silver plating was performed at different current densities. The current efficiencies of the plating were found to be 99.6, 99.5, 99.5, 98.9, 98.0, and 95.8% at current densities of 10, 12, 13, 14, 15, and 16 $A/dm^2$, respectively.

The solder bumps obtained by plating at a current density of 13 $A/dm^2$ were analyzed by electron microscopy and X-ray imaging before and after the solder reflow. As a result, the bumps could be confirmed to have smooth surface appearances after the solder reflow. The variation between the maximum and minimum heights of the within die (WID) solder bumps was 19.79±0.19 μm. The proportion of silver in the tin-silver alloy was 2.2%, as measured by atomic absorption (AA) spectrophotometry. The X-ray imaging revealed that the solder bumps had a dense structure without empty spaces.

Example 3: Influence of the Fluorinated Surfactant

In this example, the shape and characteristics of tin-silver alloy bumps were observed. Similarly to Evaluation Example 1, the tin-silver electroplating solution of Example 1 was electroplated on the 12-inch patterned wafer formed with the under bump metallurgy layer, which was prepared in Preparative Example 1, to form solder bumps. Example 3 was different from Evaluation Example 1 in that the plated patterned wafer used in Preparative Example 1 was cut into a test piece having a size of 3×3 cm², which was used as a cathode, a platinum-coated titanium electrode was used as an anode, and galvanostatic plating was performed at current densities of 5 and 10 A/dm² while stirring 250 mL of the electroplating solution at a rate of 250 rpm until the thickness reached 20 μm. The characteristics of the solder bumps were measured and the results are shown in Table 2 and FIGS. 5 (5a) and 6 (6a).

Comparative Example 1

Solder bumps were formed by tin-silver plating in the same manner as in Example 3, except that the fluorinated surfactant component was excluded from the electroplating solution. The characteristics of the solder bumps formed at densities of 5 A/dm² and 10 A/dm² were measured. The results are shown in Table 2 and FIGS. 5 (5b) and 6 (6B).

The compositions of the tin-based electroplating solutions used in Example 3 and Comparative Example 1 are summarized in Table 1.

TABLE 1

| Component | Example 3 | Comparative Example 1 |
|---|---|---|
| Tin methanesulfonate | Based on final tin concentration (95 g/L) | The same as left |
| Silver methanesulfonate | Based on final silver concentration (2.0 g/L) | The same as left |
| Potassium perfluorinated octyl sulfonate | 0.1 mg/L | — |
| Methanesulfonic acid | 100 g/L | The same as left |
| Aromatic polyoxyalkylene ethers | POE-SPE 13.5 g/L POE-BPF 1.5 g/L | The same as left |
| Thiodiglycol | 270 g/L | The same as left |
| Water | Remainder | The same as left |

※ POE-SPE: Polyoxyethylenestyrenic phenyl ether
POE-BPF: Polyoxyethylene bisphenol F ether To evaluate the appearances of the plating films obtained in Example 3 and Comparative Example 1, the shapes of the bumps before and after solder reflow were observed by SEM. The current efficiencies, silver contents (by atomic absorption spectrophotometry), empty spaces inside the bumps after reflow (by X-ray imaging), and WID values (%) were measured. The WID value was obtained by dividing the difference between the maximum and minimum heights of the within die (WID) bumps by the average height and was expressed in percent. The appearances of the bumps were relatively evaluated based on surface fineness and flatness. The bumps were judged to be "excellent" when there were no empty spaces inside the bumps, "good" when empty spaces were not larger than 0.05%, and "poor" when empty spaces were larger than 0.05%, as observed by X-ray imaging. The results are shown in Table 2 and FIG. 5.

TABLE 2

| | Evaluation of the tin-silver alloy bumps formed at 10 ASD | | | | | | |
|---|---|---|---|---|---|---|---|
| | Current | Silver | Average bump | | Bump appearance | | Empty spaces |
| Parameters | efficiency, % | content, % | thickness, μm | WID, % | Before reflow | After reflow | inside bumps after reflow |
| Example 3 | 98.2 | 2.2 | 21.18 | 0.62 | Excellent | Excellent | Excellent |
| Comparative Example 1 | 97.1 | 2.7 | 21.70 | 5.0 | Excellent-good | Excellent-good | Good |

Figure 5:
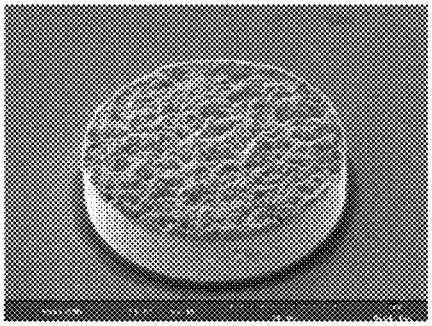
FIGS. 5 and 6 are electron microscopy images showing the shapes of tin-silver alloy solder bumps (bump CD 25 μm) formed on patterned wafer test pieces, on which copper metal pillars were formed, by electroplating under different conditions processing according to embodiments of the present invention.
Figure 6:
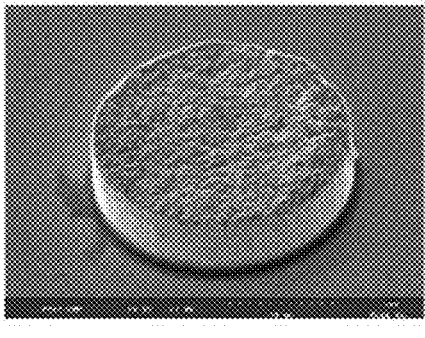

As can be seen from the comparative experiments, the characteristics of the plated structures or bumps were very different depending on the presence or absence of the fluorinated surfactant component. The fluorinated surfactant component was found to affect the grain size and shape characteristics of the plated structures, the height variations of the WID and WIW bumps, and the formation of empty spaces inside the bumps and cracks in the intermetallic layers. FIGS. 5 (5a) and 6 (6a) show SEM images of the bumps formed using the plating solution including the fluorinated surfactant component at 5 ASD and 10 ASD, respectively. FIGS. 5 (5b) and 6 (6b) show SEM images of the bumps formed using the plating solution without the fluorinated surfactant component at 5 ASD and 10 ASD, respectively. Particularly, the solder bumps of Comparative Example 1, which were formed using the tin-silver electroplating solution free of the fluorinated surfactant component, had greatly increased height variations of WID bumps, damaging the uniformity of the bump pattern, and the silver content relative to the tin content of the solder bumps showed a tendency to increase (FIG. 2). Differences were also found in current efficiency and the proportion of empty spaces inside the bumps after reflow.

What is claimed is:

1. A tin-based electroplating solution, comprising:
    tin methanesulfonate in such an amount that the tin content of the plating solution is from 40 to 105 g/L;
    silver methanesulfonate, as an optional component, in such an amount that the silver content of the plating solution is from 0.40 to 3.0 g/L; 70 to 210 g/L of methanesulfonic acid; 0.01 to 100 mg/L of a fluorinated surfactant; 0.5 to 60 g/L of an aromatic polyoxyalkylene ether; and water
    wherein the fluorinated surfactant contains alkali perfluoroalkyl phosphate species of 1-I and 1-II represented by Formula 1 and water, (1)

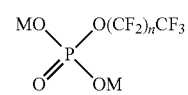

1-I

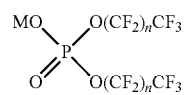

1-II wherein each n is an integer from 5 to 11 and each M is at least one alkali metal selected from the group consisting of sodium, potassium, and wherein the surfactant composition is in the form of a solid and the water content is from 0.1 to 3.0% by weight.

2. The electroplating solution according to claim 1, wherein the electroplating solution contains 0.05 to 10 mg/L of the fluorinated surfactant.

3. The electroplating solution according to claim 1, wherein the fluorinated surfactant is selected from an alkali perfluoroalkyl phosphate salt, a perfluoroalkyl sulfate, a perfluoroalkyl sulfonate salt, and mixtures thereof.

4. The electroplating solution according to claim 1, wherein the fluorinated surfactant contains a perfluoroalkyl sulfamate of Formula 2 and water, (2)

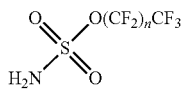

wherein n is an integer from 5 to 11.

5. The electroplating solution according to claim 1, wherein the fluorinated surfactant contains a perfluoroalkyl sulfonate salt of Formula 3 and water, (3)

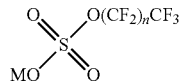

wherein n is an integer ranging from 5 to 11 and M is an alkali metal.

6. A method of forming solder bumps for a flip chip, comprising: electroplating a silicon wafer having a protective layer through which an electrode pad is exposed and an under bump metallurgy (UBM) layer with a copper or copper/nickel plating solution to form copper or copper/nickel pillars on the under bump metallurgy layer; and electroplating the pillars with the tin-based electroplating solution according to claim 1 to form solder bumps.

7. The method according to claim 6, wherein the solder bumps are formed within 12 hours after the formation of the metal pillars.

8. A tin-based electroplating solution, comprising:
tin methanesulfonate in such an amount that the tin content of the plating solution is from 40 to 105 g/L; silver methanesulfonate, as an optional component, in such an amount that the silver content of the plating solution is from 0.40 to 3.0 g/L; 70 to 210 g/L of methanesulfonic acid; 0.01 to 100 mg/L of a fluorinated surfactant; 0.5 to 60 g/L of an aromatic polyoxyalkylene ether; and water, wherein the fluorinated surfactant contains a perfluoroalkyl sulfamate of Formula 2 and water, (2)

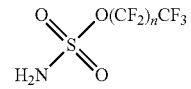

wherein n is an integer from 5 to 11.

9. The electroplating solution according to claim 8, wherein the electroplating solution contains 0.05 to 10 mg/L of the fluorinated surfactant, and wherein the fluorinated surfactant is selected from an alkali perfluoroalkyl phosphate salt, a perfluoroalkyl sulfate, a perfluoroalkyl sulfonate salt, and mixtures thereof.

10. The electroplating solution according to claim 8, wherein the fluorinated surfactant contains alkali perfluoroalkyl phosphate species of 1-I and 1-II represented by Formula 1 and water, (1)

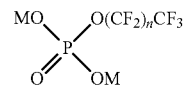

1-I

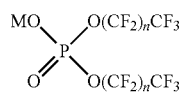

1-II wherein each n is an integer from 5 to 11 and each M is at least one alkali metal selected from the group consisting of sodium, potassium, and wherein the surfactant composition is in the form of a solid and the water content is from 0.1 to 3.0% by weight.

* * * * *